US008854827B2

(12) United States Patent
Tanaka et al.

(10) Patent No.: US 8,854,827 B2
(45) Date of Patent: Oct. 7, 2014

(54) ELECTRONIC CONTROL UNIT

(75) Inventors: Takaaki Tanaka, Chiyoda-ku (JP);
Yasuhiro Takahashi, Chiyoda-ku (JP);
Toru Kubo, Minato-ku (JP); Seiji Kato,
Minato-ku (JP); Hideki Umemoto,
Chiyoda-ku (JP)

(73) Assignee: Mitsubishi Electric Corporation,
Tokyo (JP)

( * ) Notice: Subject to any disclaimer, the term of this patent is extended or adjusted under 35 U.S.C. 154(b) by 240 days.

(21) Appl. No.: 13/596,553

(22) Filed: Aug. 28, 2012

(65) Prior Publication Data

US 2013/0271933 A1    Oct. 17, 2013

(30) Foreign Application Priority Data

Apr. 16, 2012 (JP) ................................. 2012-092598

(51) Int. Cl.
*H05K 5/00* (2006.01)

(52) U.S. Cl.
USPC ........... 361/752; 361/730; 361/714; 361/715; 361/722; 174/377; 174/378; 174/259

(58) Field of Classification Search
USPC .......... 361/752, 730, 714, 715, 722; 174/377, 174/378, 259, 66, 67, 68.1
See application file for complete search history.

(56) References Cited

U.S. PATENT DOCUMENTS

| | | | |
|---|---|---|---|
| 7,120,024 B2 * | 10/2006 | Watanabe et al. | 361/704 |
| 7,719,833 B2 * | 5/2010 | Inagaki | 361/688 |
| 7,751,193 B2 * | 7/2010 | Tominaga et al. | 361/715 |
| 7,791,888 B2 * | 9/2010 | Tominaga et al. | 361/708 |
| 8,230,575 B2 * | 7/2012 | Veenstra et al. | 29/592.1 |

FOREIGN PATENT DOCUMENTS

| | | |
|---|---|---|
| JP | 07-237267 A | 9/1995 |
| JP | 2003-258454 A | 9/2003 |
| JP | 2010-056493 A | 3/2010 |

OTHER PUBLICATIONS

Japanese Office Action issued Apr. 23, 2013, in Japanese Patent Application No. 2012-092598.

* cited by examiner

*Primary Examiner* — Robert J Hoffberg
*Assistant Examiner* — Hung Dang
(74) *Attorney, Agent, or Firm* — Sughrue Mion, PLLC; Richard C. Turner

(57) ABSTRACT

An electronic control unit is configured in such a way that the groove-shaped concave portion of the second case member includes a first concave portion, in which a groove width at a bottom surface side is narrow, and a second concave portion, in which a groove width at an aperture surface side is wide, and the first concave portion and the second concave portion are linked by an inclined step portion in such a way that a groove width at the step portion is increased in a direction from the bottom surface side to the aperture surface side, and moreover, a tip of the rail-shaped convex portion of the first case member is fitted into the first concave portion at the bottom surface side of the second case member.

10 Claims, 7 Drawing Sheets

US 8,854,827 B2

ELECTRONIC CONTROL UNIT

BACKGROUND OF THE INVENTION

1. Field of the Invention

The present invention relates to an electronic control unit in which an electronic circuit board is housed in a case.

2. Description of the Related Art

An electronic control unit, used for controlling a car or the like, usually has a configuration in which electronic components, which are an input-output circuit, a microcomputer, a power circuit or the like, are mounted on a print board as an electronic circuit board, and a connector, which is used for connecting an outer device, is arranged on the print board, and then, the print board is housed in a case. In addition, there is a well-known electronic control unit in which a base and a cover, which are separated in an upper-lower direction, are used, and a print board, on which a connector is attached, is sandwiched, and then, connection surfaces for the base, cover, and the connector are bonded by a waterproof sealing compound (for example, refer to Patent Document 1).

[Patent Document 1]

Japanese Laid-Open Patent Publication No. 2003-258454

However, in the above-configured electronic control unit, a sealing capability of the electronic control unit depends on a sealing capability or a coat condition of a waterproof sealing compound such as a sealing adhesive. In particular, when a resin member is used for any of case materials, there have been problems in that a bias of sealing adhesive residence is caused in accordance with a size variation caused by a size change according to contraction or warpage of the member, which is generated at forming the resin member, and a desired coat condition is not realized, whereby a mating surface is incompletely bonded, and a waterproof faulty is frequently caused.

Moreover, there has been a problem in that a defect is caused in accordance with the size variation according to the contraction or the warpage of the member, which is generated at forming the resin member.

SUMMARY OF THE INVENTION

The present invention has been made to solve the above-described problems, and an object of the invention is to provide an electronic control unit in which a size variation of a molded component is absorbed, and a sealing compound is certainly kept at a bonding portion, whereby an adhesive capability is ensured.

An electronic control unit of the present invention includes an electronic circuit board on which electronic components are mounted; and a case for housing the electronic circuit board; wherein the case is composed of two case members fitted together and has a configuration in which a rail-shaped convex portion of a first case member is fitted to a groove-shaped concave portion of a second case member, and both case members are bonded and assembled by an adhesive between the rail-shaped convex portion of the first case member and the groove-shaped concave portion of the second case member; and moreover, the case is configured in such a way that the groove-shaped concave portion of the second case member includes a first concave portion, in which a groove width at a bottom surface side is narrow, and a second concave portion, in which a groove width at an aperture surface side is wide; and the first concave portion and the second concave portion are linked by an inclined step portion in which a groove width at the step portion is increased in a direction from the bottom surface side to the aperture surface side; and a tip of the rail-shaped convex portion of the first case member is fitted into the first concave portion at the bottom surface side of the second case member.

According to the electronic control unit of the present invention, the first case member having the rail-shaped convex portion is positioned with respect to the second case member having the groove-shaped concave portion by fitting the tip of the rail-shaped convex portion of the first case member into the first concave portion at the bottom surface side of the second case member, and an adhesive capability of the both case members can be ensured by keeping an adhesive compound in the second concave portion at the aperture surface side of the second case member, whereby a waterproof capability of the cases can be accurately and certainly ensured, and a production cost can be reduced by decreasing a faulty ratio.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Hereinafter, an electronic control unit according to each of embodiments of the present invention will be explained in reference to drawings. Here, reference symbols, which are the same as those in each drawing, refer to the same or equivalent parts so as to be explained.

Embodiment 1

Figure 1:
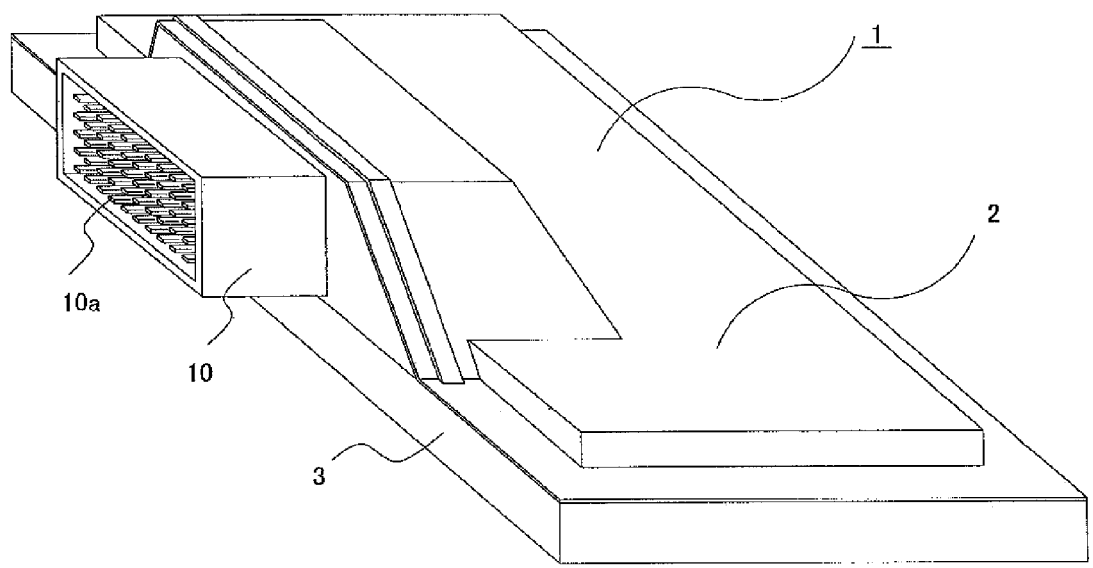
FIG. 1 is an oblique perspective view illustrating an electronic control unit according to Embodiment 1 of the present invention.
Figure 2:
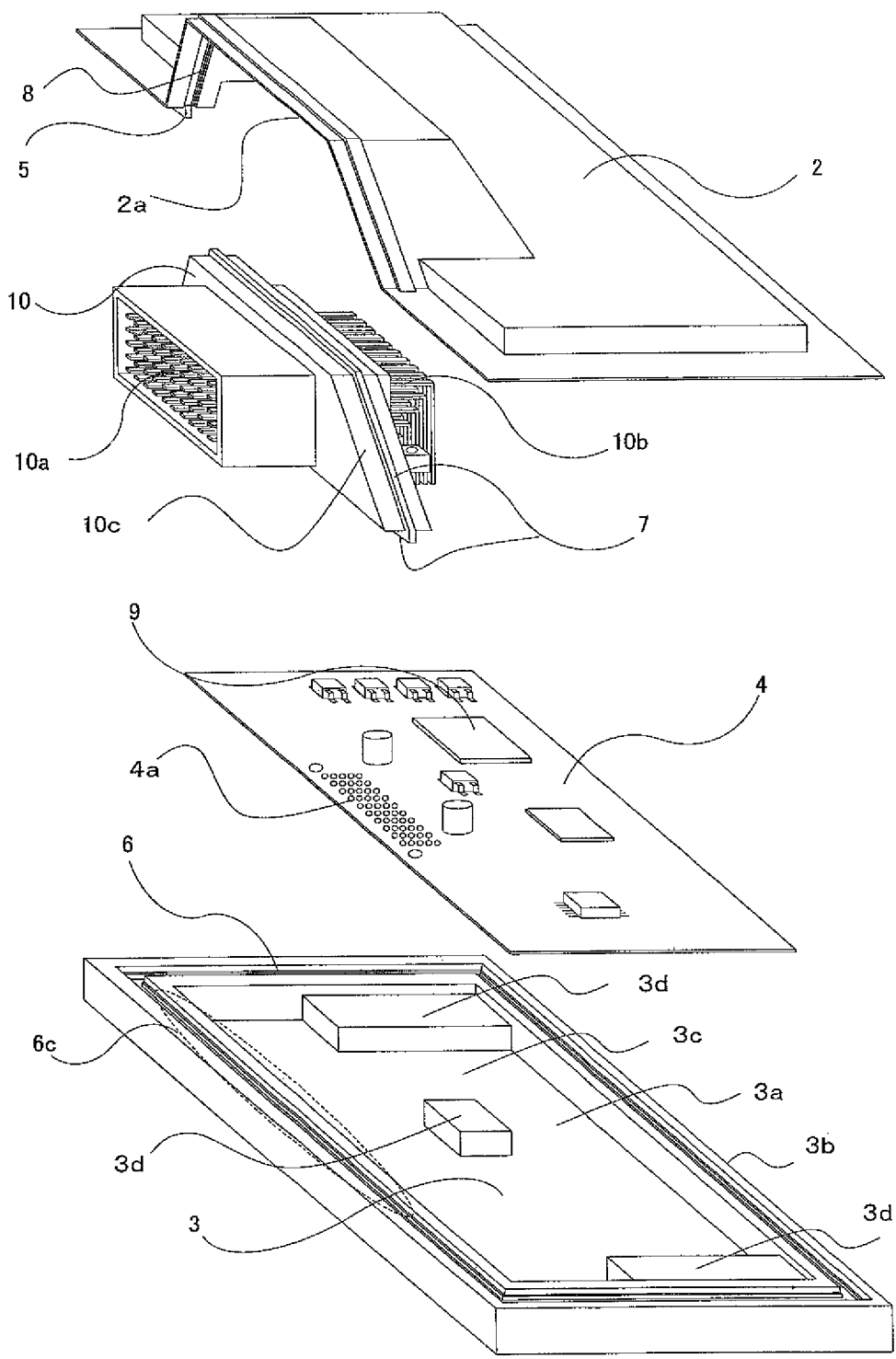
FIG. 2 is a disassembled oblique perspective view illustrating an internal structure of the electronic control unit according to Embodiment 1 of the present invention.

FIG. 1 is an oblique perspective view illustrating an electronic control unit according to Embodiment 1 of the present invention. FIG. 2 is a disassembled oblique perspective view illustrating an internal structure of the electronic control unit according to Embodiment 1 of the present invention. An electronic control unit 1 is mounted on, for example, an engine in an engine room, and an electronic circuit board 4, on which an electronic component 9 and a connector 10 are mounted, is housed in a case having an upper-lower division system, which includes a cover (first case member) 2 and a base (second case member) 3. The base 3 is made from, for example, aluminum, stainless steel, or PBT (polybutylene terephthalate) resin, and the cover 2 is made from, for example, PBT resin or the like. An internal terminal 10b of the connector 10 is inserted to through holes 4a of the electronic circuit board 4 and connected to an electric circuit (not illustrated), such as an input-output device, so as to be fixed.

The base 3 is formed for example, in a square shape, and a square frame 3b combined to a base plate 3a is formed at an outer circumference of the base 3, and moreover, a storage room 3c of the electronic circuit board 4 is formed by using the base plate 3a and the square frame 3b. Radiating portions 3d doubling as spacers are arranged at a center portion and both sides facing each other in the storage room 3c. The electronic circuit board 4 is disposed above the radiating portions 3d in the storage room 3c of the base 3 by sandwiching a thermal conducting material, such as a silicon material including, for example, a ceramic powder, and surrounded by the square frame 3b so as to be arranged. The connector 10 is contacted with an aperture 2a formed between the cover 2 and the base 3, and has a structure in which an external terminal 10a for being connected to an outer device (not illustrated) is protruded from the aperture 2a.

Specifically, in the base 3, a groove-shaped concave portion 6 for fitting to the cover 2 and the connector 10 is formed on an upper surface of the square frame 3b of the base 3, and a rail-shaped convex portion 5 and a rail-shaped convex portion 7, which are fitted to the groove-shaped concave portion 6 of the base 3, are respectively formed at an outer circumference of the cover 2 and a flange portion 10c of the connector 10. In a similar way, a groove-shaped concave portion and a rail-shaped convex portion, which are used for fitting, are formed between the cover 2 and the connector 10. Moreover, a groove-shaped concave portion 8 is formed at an outer circumference of the aperture 2a of the cover 2, and the continuous rail-shaped convex portion 7, which is also fitted to the base 3, is formed at the flange portion 10c facing to the connector 10.

Figure 3:
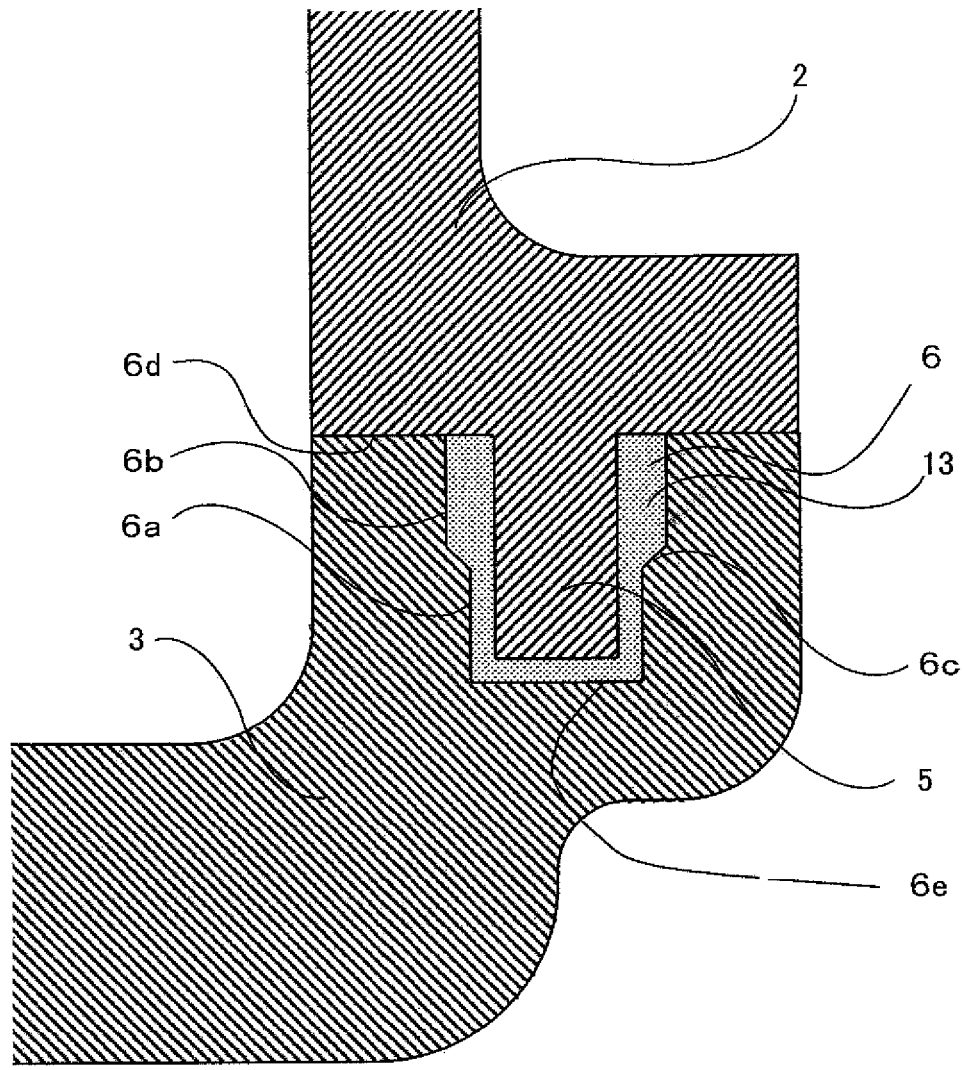
FIG. 3 is a cross-sectional view illustrating a case member connecting portion of the electronic control unit according to Embodiment 1 of the present invention.

FIG. 3 is a partial cross-sectional view for enlarging and illustrating a case member connecting portion of the electronic control unit. Although an outline of the unit illustrated in FIG. 3 is partially different from an outline of the unit illustrated in FIG. 1, a connecting portion indicating a groove-shaped concave portion and a rail-shaped convex portion illustrated in FIG. 3 is the same connecting portion illustrated in FIG. 1. Cross-section shapes of the groove-shaped concave portions 6 and 8 (hereinafter, symbol 6 is representative) and rail-shaped convex portions 5 and 7 (hereinafter, symbol 5 is representative) are illustrated in FIG. 3. A sealing compound 13 (for example, an adhesive such as a silicon adhesive or a polyurethane adhesive) is coated on the groove-shaped concave portion 6, and the rail-shaped convex portion 5 is fitted into the groove-shaped concave portion 6, whereby the cover 2, the base 3, and the connector 10 are mutually bonded, and a waterproof effect is obtained.

The groove-shaped concave portion 6 of the second case member includes a first concave portion 6a, in which a groove width at a bottom surface 6e side is narrow, and a second concave portion 6b, in which a groove width at an aperture surface 6d side is wide. Moreover, the first concave portion 6a and the second concave portion 6b are linked by an inclined step portion 6c in such a way that a groove width at the step portion 6c is increased in a direction from the bottom surface 6e side to the aperture surface 6d side. The rail-shaped convex portion 5 is configured in such a way that a tip of the rail-shaped convex portion 5 of the first case member is fitted into the first concave portion 6a at the bottom surface 6e side.

Hereinafter, an assembly process for the electronic control unit 1 configured as described above will be explained in reference to FIG. 2. Firstly, the internal terminal 10b of the connector 10 is inserted to the through holes 4a of the electronic circuit board 4 so as to be electrically connected, and mechanically fixed. Secondly, within the groove-shaped concave portion 6 provided on the base 3, the sealing compound 13 is coated on a connecting portion, which is faced to the connector 10, of the groove-shaped concave portion 6, and the electronic circuit board 4, on which the connector 10 is mounted, is attached and installed to the storage room 3c of the base 3. Thirdly, within the groove-shaped concave portion 6 provided on the base 3 and the aperture surface 6d of the groove-shaped concave portion 6, the sealing compound 13 is coated on an area, in which the connecting portion, which is faced to the connector 10, of the groove-shaped concave portion 6 is excluded, and on the groove-shaped concave portion 8 provided in the cover 2, and the cover 2 is attached to the base 3 on which the electronic circuit board 4 is attached. As a result, the electronic control unit 1 is produced in a shape, in which the electronic circuit board 4, to which connector 10 is attached, is sandwiched from an upper-lower direction by the cover 2 and the base 3.

In the electronic control unit according to Embodiment 1, the groove-shaped concave portion 6 has a shape in which the groove width of the second concave portion 6b at the aperture surface side is wider than the groove width of the first concave portion 6a at the bottom surface side, so that the rail-shaped convex portion 5 can be easily fitted into the groove-shaped concave portion 6, even if a size of the rail-shaped convex portion 5 is varied. Moreover, the groove-shaped concave portion 6 has a shape in which an inclined step portion 6c is formed at a halfway position in such a way that a groove width at the step portion 6c is increased in a direction from the bottom surface 6e side to the aperture surface 6d side. Therefore, when the rail-shaped convex portion 5 is fitted into the groove-shaped concave portion 6, even if the size of the rail-shaped convex portion 5 is varied, a tip of the rail-shaped convex portion 5 can be easily fitted into the first concave portion 6a of the groove-shaped concave portion 6, and a position of the rail-shaped convex portion 5 is corrected in accordance with a two-step concave shape of the groove-shaped concave portion 6, whereby the rail-shaped convex portion 5 can be accurately arranged at a center portion of the groove-shaped concave portion 6.

Moreover, the groove-shaped concave portion 6 has a shape in which a width of the second concave portion 6b at the aperture surface 6d side is wider than a width of the first concave portion 6a at the bottom surface 6e side. Therefore, although the electronic control unit is configured in such a way that a sealing characteristic is obtained by keeping the sealing compound 13 between the rail-shaped convex portion 5 and the groove-shaped concave portion 6, the rail-shaped convex portion 5 can be accurately arranged at the center portion of the groove-shaped concave portion 6 by an effect of the first concave portion 6a at the bottom surface 6e side of the groove-shaped concave portion 6, whereby a constant sealing characteristic can be obtained at all times.

In addition, the configuration of the above-described case member connecting portion realizes a high effect, when a sealing compound, such as a silicon adhesive or the like, which realizes a sealing characteristic by remaining with a certain thickness, is especially used. Moreover, the configuration of the case member connecting portion realizes a special effect, when a member, such as a resin member, in which a size is relatively varied in accordance with contraction or warpage of the member, which is generated at forming the member, is especially used for a part of the case member or a whole of the case member.

Embodiment 2

Figure 4:
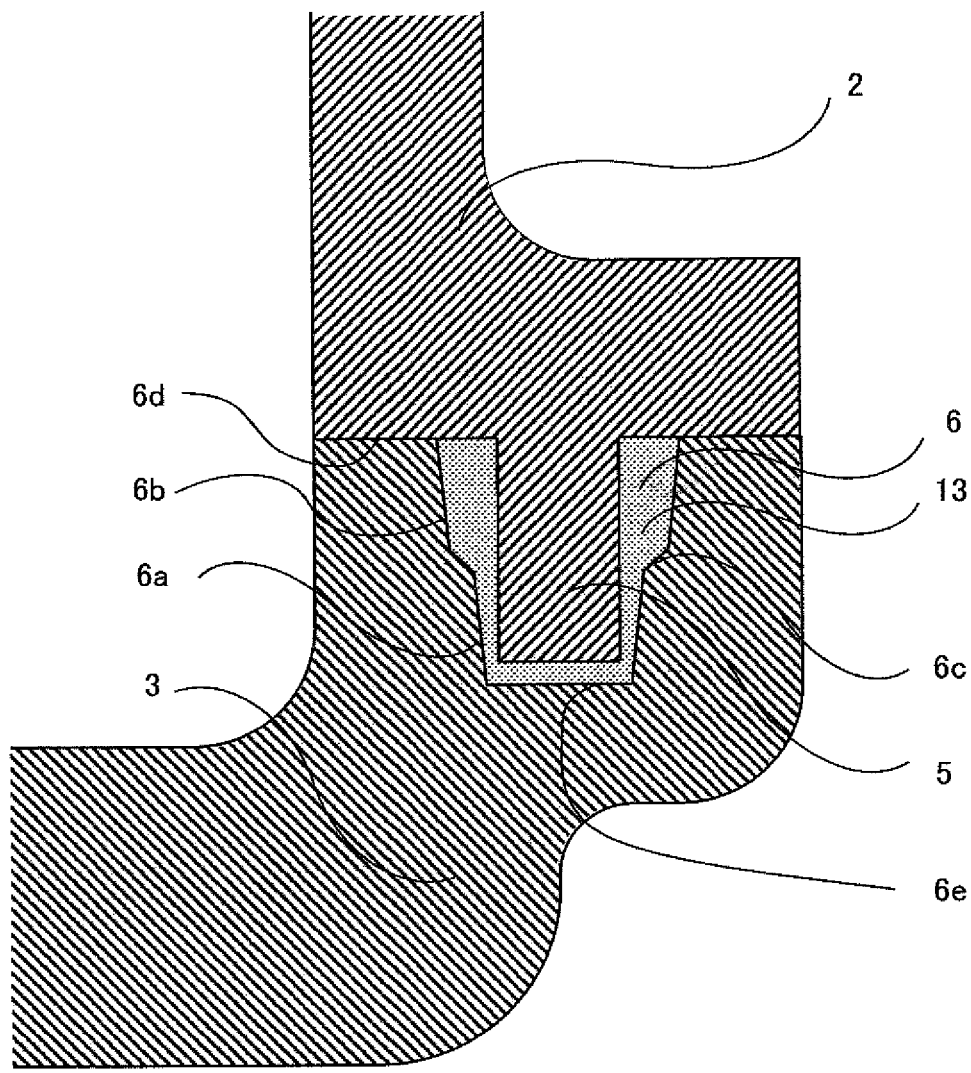
FIG. 4 is a cross-sectional view illustrating a case member connecting portion of an electronic control unit according to Embodiment 2 of the present invention.

FIG. 4 is a cross-sectional view illustrating a case member connecting portion of an electronic control unit according to Embodiment 2 of the present invention. In the electronic control unit according to Embodiment 2, a first concave portion 6a at a bottom surface 6e side and a second concave portion 6b at an aperture surface 6d side, by which a groove-shaped concave portion 6 of a second case member are configured, are respectively formed in such a way that each of groove widths is increased in a direction from the bottom surface 6e side to the aperture surface 6d side. As a result, the groove width, illustrated in FIG. 4, of the second concave portion 6b at the aperture surface 6d side is wider than the groove width, illustrated in FIG. 3, of the second concave portion 6b at the aperture surface 6d side, so that a rail-shaped convex portion 5 can be easily inserted to the groove-shaped concave portion 6, even when a size of the rail-shaped convex portion 5 is greatly varied. The above-described effect is especially enhanced, when the groove width of the second concave portion 6b at the aperture surface 6d side is more increased. Therefore, if an insertion of the rail-shaped convex portion 5 is sufficiently improved by the effect, it is not always required that a groove width at an aperture side of the first concave portion 6a positioned at the bottom surface 6e side is expanded.

In the electronic control unit according to Embodiment 2, a inclined step portion 6c, by which the first concave portion 6a and the second concave portion 6b are linked in the groove-shaped concave portion 6 of the second case member, is provided at each of both sides of the groove-shaped concave portion 6. When the groove-shaped concave portion 6 is formed as described above, an adhesive can easily remain at both sides of the groove-shaped concave portion 6, so that a sealing capability and an adhesive capability are more increased.

Embodiment 3

Figure 5:
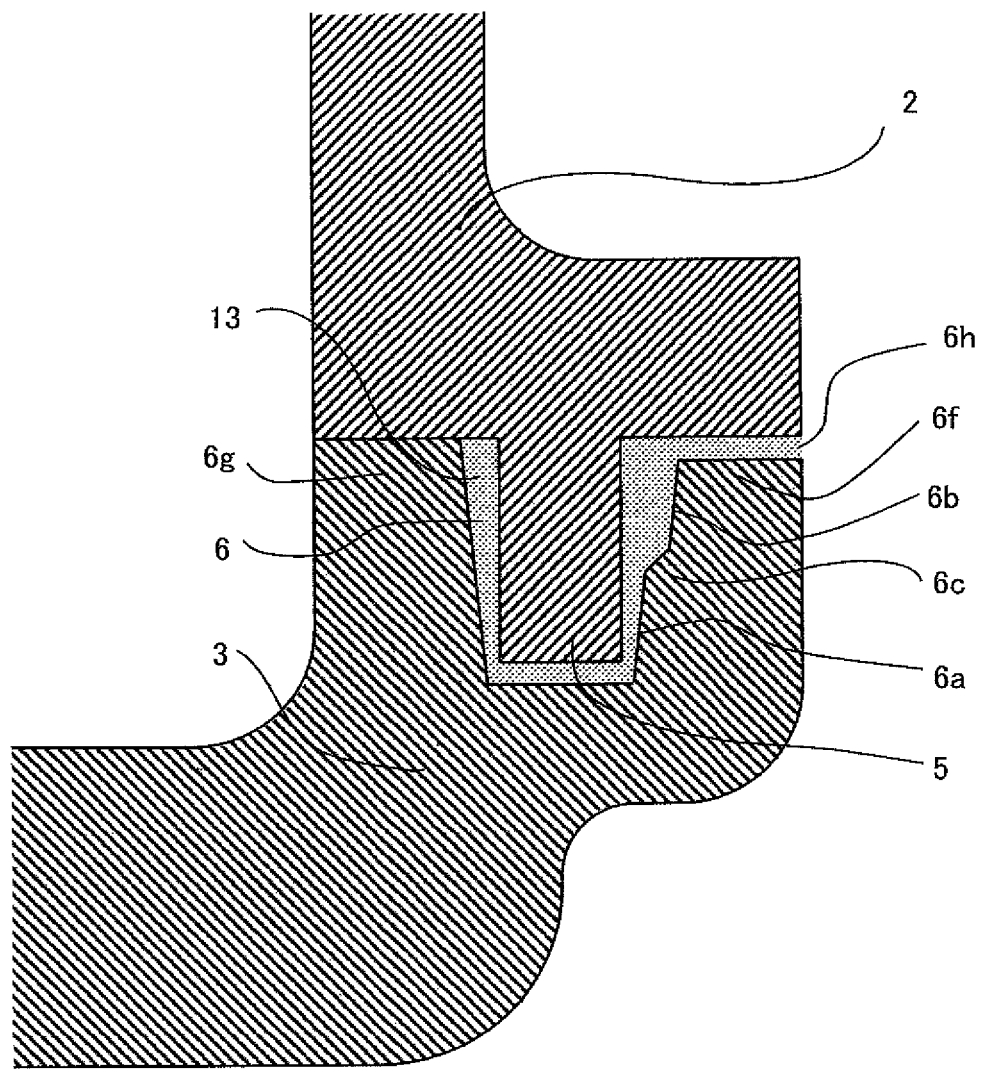
FIG. 5 is a cross-sectional view illustrating a case member connecting portion of an electronic control unit according to Embodiment 3 of the present invention.

FIG. 5 is a cross-sectional view illustrating a case member connecting portion of an electronic control unit according to Embodiment 3 of the present invention. In the electronic control unit according to Embodiment 3, an inclined step portion 6c, by which the first concave portion 6a and the second concave portion 6b are linked in a groove-shaped concave portion 6 of a second case member, is provided at an outer edge side of the groove-shaped concave portion 6. In other words, the step portion 6c is provided at an outer circumference edge side, and the step portion 6c is not provided at an inner edge side, whereby the inner edge side of the first concave portion 6a and the second concave portion 6b are linearly shaped. In addition, "6f" indicates an outer edge portion composing the groove-shaped concave portion 6, and "6g" indicates an inner edge portion composing the groove-shaped concave portion 6.

In the electronic control unit according to Embodiment 3, the outer edge portion 6f at an aperture surface of the groove-shaped concave portion 6 in the second case member is formed in such a way that the outer edge portion 6f is lower than the inner edge portion 6g, and a slit-shaped aperture 6h is formed at the outer edge portion 6f at a connecting portion in the second case member, when a rail-shaped convex portion 5 of the first case member is fitted and connected to the groove-shaped concave portion 6 in the second case member. A sealing compound 13 mainly remains at the outer edge side of the groove-shaped concave portion 6, so that the sealing compound 13, which remains in the case member, can be visually confirmed from the slit-shaped aperture 6h.

Embodiment 4

Figure 6:
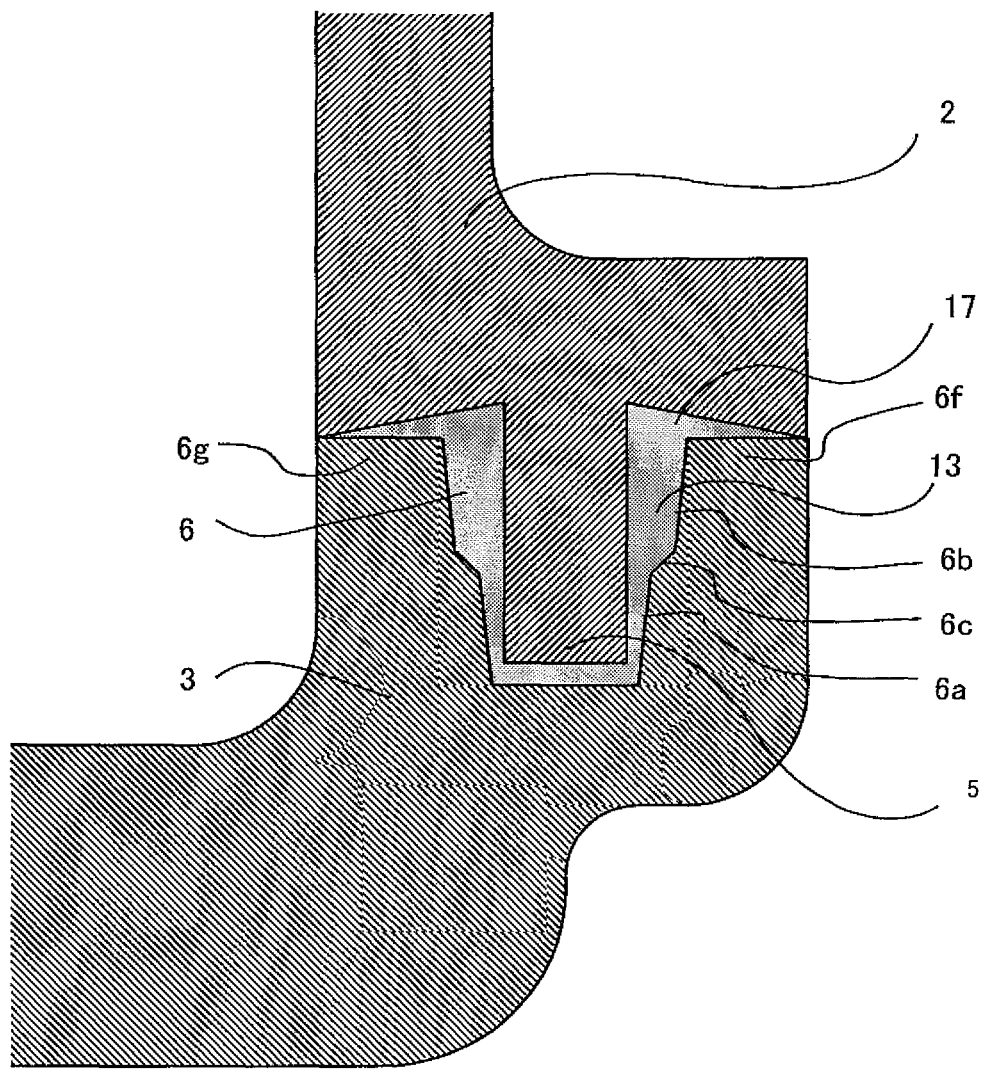
FIG. 6 is a cross-sectional view illustrating a case member connecting portion of an electronic control unit according to Embodiment 4 of the present invention.
Figure 7:
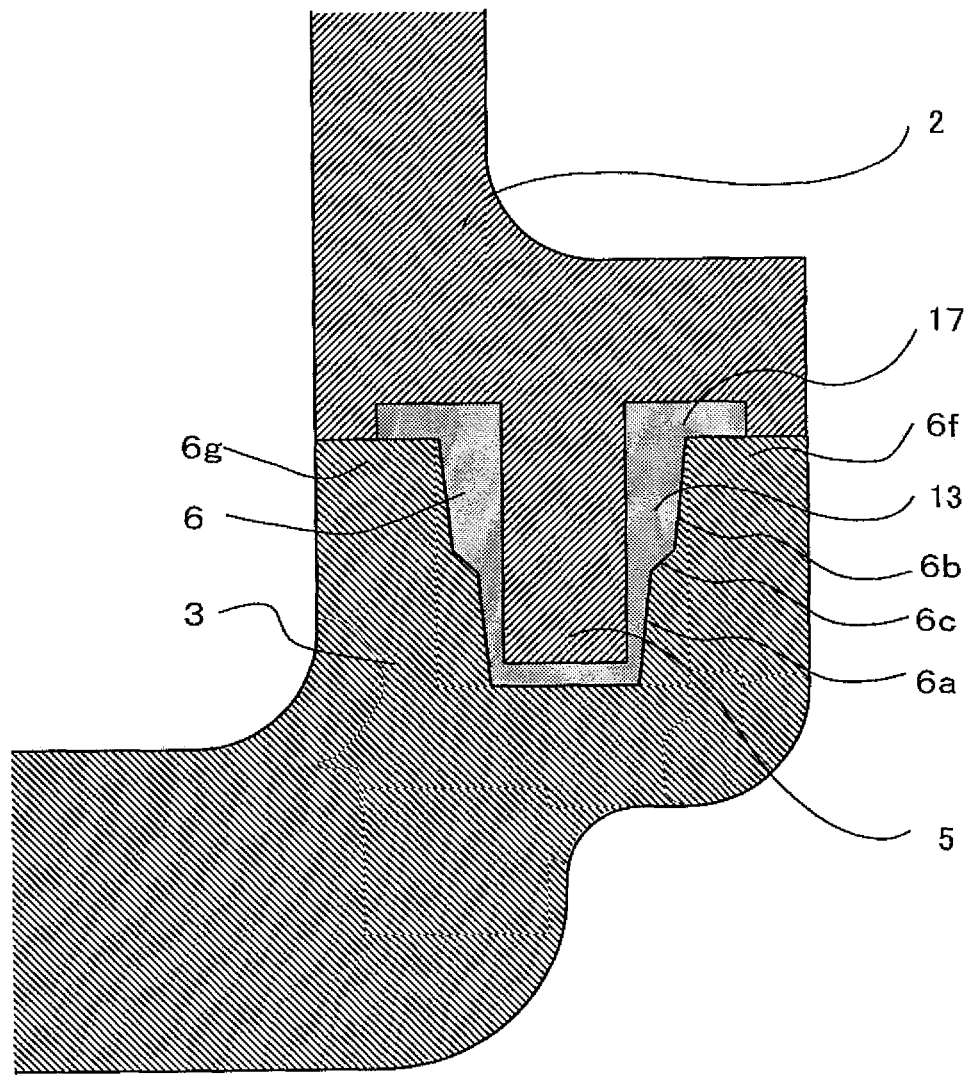
FIG. 7 is a cross-sectional view illustrating a case member connecting portion of another electronic control unit according to Embodiment 4 of the present invention.

FIG. 6 is a cross-sectional view illustrating a case member connecting portion of an electronic control unit according to Embodiment 4 of the present invention. FIG. 7 is a cross-sectional view illustrating a case member connecting portion of another electronic control unit according to Embodiment 4 of the present invention. In the electronic control unit according to Embodiment 4, when a rail-shaped convex portion 5 of a first case member is fitted and connected to a groove-shaped concave portion 6 of a second case member, a concave portion 17 linked with the groove-shaped concave portion 6 is formed at a connecting portion for both case members.

In FIG. 6, the concave portion 17, in which a cross section has a triangular shape, is formed at a base of the rail-shaped convex portion 5 of the cover 2 in such a way that the concave portion 17 linked with the groove-shaped concave portion 6 is formed at a connecting portion for the first case member (cover 2) having the rail-shaped convex portion 5 and the second case member (base 3) having the groove-shaped concave portion 6. In FIG. 7, the concave portion 17, in which a cross section has a square shape, is formed at a base of the rail-shaped convex portion 5 of the cover 2. In each of FIG. 6 and FIG. 7, the connecting portion for the base 3 and cover 2 has a shape in which an outer surface of the connecting portion is closed. In addition, the concave portion 17 may be provided at the base 3 side. In FIG. 6 and FIG. 7, the case members have a configuration in which the sealing compound 13 remains in the groove-shaped concave portion 6 and the concave portion 17. Therefore, a sealing cross-sectional area is expanded, and a sealing capability can be more increased.

The above-described electronic control unit 1 is mounted on an engine in an engine room and exposed in an environment in which a temperature is rapidly varied. Therefore, when condensation or the like occurs in the electronic control unit 1, there is a possibility that an electronic circuit on the electronic circuit board 4 is shorted and broken. In order to prevent the electronic circuit from being shorted and broken, a dampproof coating is performed for the electronic circuit board 4 by a coating compound, such as a silicon resin or the like.

In addition, it is one example that the electronic control unit 1 of the present invention is mounted on the engine in the engine room, and the electronic control unit 1 can be obviously installed in an area without the engine room. Moreover, in the above-described embodiments, a connecting member, which is configured by the groove-shaped concave portions 6 and 8, the rail-shaped convex portions 5 and 7, and the sealing compound 13, is explained as a sealing means for sealing interfaces between the cover 2, the base 3, and the connector 10. However, components for the connecting member are not limited to the above-described components, and it is obvious that a connecting member, which includes a connecting portion for fitting by using a similar groove-shaped concave portion and rail-shaped convex portion, can be applied. In addition, it is possible within a scope of the present invention that the components in each of the embodiments are freely combined, or the components in each of the embodiments are suitably modified or omitted.

What is claimed is:

1. An electronic control unit comprising:
    an electronic circuit board on which electronic components are mounted; and a case for housing the electronic circuit board; wherein
    the case is composed of two case members fitted together and has a configuration in which a rail-shaped convex portion of a first case member is fitted to a groove-shaped concave portion of a second case member, and both case members are bonded and assembled by an adhesive between the rail-shaped convex portion of the first case member and the groove-shaped concave portion of the second case member; and moreover, the case is configured in such a way that the groove-shaped concave portion of the second case member includes a first concave portion, in which a groove width at a bottom surface side is narrow, and a second concave portion, in which a groove width at an aperture surface side is wide; and the first concave portion and the second concave portion are linked by an inclined step portion in which a groove width at the step portion is increased in a direction from the bottom surface side to the aperture surface side; and a tip of the rail-shaped convex portion of the first case member is fitted into the first concave portion at the bottom surface side of the second case member.

2. An electronic control unit as recited in claim 1, wherein the first concave portion at the bottom surface side and the second concave portion at the aperture surface side, by which the groove-shaped concave portion of the second case member is formed, are formed in such a way that each of groove widths of the concave portions is increased in a direction from the bottom surface side to the aperture surface side.

3. An electronic control unit as recited in claim 1, wherein the inclined step portion, which links the first concave portion and the second concave portion in the groove-shaped concave portion of the second case member, is provided at each of both sides of the groove-shaped concave portion.

4. An electronic control unit as recited in claim 2, wherein the inclined step portion, which links the first concave portion and the second concave portion in the groove-shaped concave portion of the second case member, is provided at each of both sides of the groove-shaped concave portion.

5. An electronic control unit as recited in claim 1, wherein the inclined step portion, which links the first concave portion and the second concave portion in the groove-shaped concave portion of the second case member, is provided at an outer edge portion of the groove-shaped concave portion.

6. An electronic control unit as recited in claim 2, wherein the inclined step portion, which links the first concave portion and the second concave portion in the groove-shaped concave portion of the second case member, is provided at an outer edge portion of the groove-shaped concave portion.

7. An electronic control unit as recited in claim 1, wherein an outer edge portion at an aperture surface of the groove-shaped concave portion in the second case member is formed in such a way that the outer edge portion is lower than an inner edge portion, and a slit-shaped aperture is formed at the outer edge portion at a connecting portion in the second case member, when a rail-shaped convex portion of the first case member is fitted and connected to the groove-shaped concave portion in the second case member.

8. An electronic control unit as recited in claim 5, wherein an outer edge portion at an aperture surface of the groove-shaped concave portion in the second case member is formed in such a way that the outer edge portion is lower than an inner edge portion, and a slit-shaped aperture is formed at the outer edge portion at a connecting portion in the second case member, when a rail-shaped convex portion of the first case member is fitted and connected to the groove-shaped concave portion in the second case member.

9. An electronic control unit as recited in claim 1, wherein a concave portion linked with the groove-shaped concave portion is formed at a connecting portion for both case members, when the rail-shaped convex portion of the first case member is fitted and connected to the groove-shaped concave portion of the second case member.

10. An electronic control unit as recited in claim 1, wherein a connector 10 for connecting with an outer device is mounted on the electronic circuit board, and the case is composed of the base and the cover as the case members, and moreover, the electronic circuit board, on which the electronic components and the connector are mounted, is sandwiched by the base and the cover as the case members so as to be housed in the case.

\* \* \* \* \*